(12) United States Patent
Farrnbacher et al.

(10) Patent No.: US 9,583,740 B2
(45) Date of Patent: Feb. 28, 2017

(54) OPTOELECTRONIC COMPONENT, CONTACT-MAKING DEVICE, AND OPTOELECTRONIC SUBASSEMBLY

(71) Applicant: OSRAM OLED GmbH, Regensburg (DE)

(72) Inventors: Joerg Farrnbacher, Regensburg (DE); Simon Schicktanz, Regensburg (DE)

(73) Assignee: OSRAM OLED GmbH, Regensburg (DE)

( * ) Notice: Subject to any disclaimer, the term of this patent is extended or adjusted under 35 U.S.C. 154(b) by 0 days.

(21) Appl. No.: 15/029,678

(22) PCT Filed: Oct. 16, 2014

(86) PCT No.: PCT/EP2014/072204
§ 371 (c)(1),
(2) Date: Apr. 15, 2016

(87) PCT Pub. No.: WO2015/055760
PCT Pub. Date: Apr. 23, 2015

(65) Prior Publication Data
US 2016/0276630 A1    Sep. 22, 2016

(30) Foreign Application Priority Data
Oct. 16, 2013 (DE) .......... 10 2013 111 422

(51) Int. Cl.
*H01L 33/00* (2010.01)
*H01L 51/56* (2006.01)
(Continued)

(52) U.S. Cl.
CPC .............. *H01L 51/56* (2013.01); *H01L 24/72* (2013.01); *H01L 51/5203* (2013.01);
(Continued)

(58) Field of Classification Search
CPC . H01L 51/524; H01L 51/525; H01L 51/5253; H01L 51/5296
(Continued)

(56) References Cited

U.S. PATENT DOCUMENTS

2002/0125815 A1    9/2002  Wakita
2009/0129724 A1*   5/2009  Carter ................. H01L 27/3269
                                                                  385/14
(Continued)

FOREIGN PATENT DOCUMENTS

DE    102011077687 A1    12/2012
DE    102012210484 A1    12/2013
(Continued)

OTHER PUBLICATIONS

German Search Report based on Application No. 10 2013 111 422.9 (8 Pages) dated Sep. 23, 2014 (Reference Purpose Only).
(Continued)

*Primary Examiner* — Brook Kebede
(74) *Attorney, Agent, or Firm* — Viering, Jentschura & Partner mbB

(57) ABSTRACT

An optoelectronic component include a carrier body, an optoelectronic layer structure formed above the carrier body and having at least one contact region for contacting the optoelectronic layer structure, a covering body arranged above the optoelectronic layer structure, at least one contact cutout extending through the covering body and/or the carrier body. The contact cutout has a first and a second cutout regions, which lead into one another and which extend from an outer surface of the covering body and/or of the carrier body in a layer plane direction where the contact region is formed. A first clear width of the contact cutout near the corresponding outer surface in the first cutout region is greater than a second clear width in the second
(Continued)

cutout region near the corresponding outer surface. The second clear width is less than a third clear width of the second cutout region near the contact region.

16 Claims, 7 Drawing Sheets

(51) Int. Cl.
  *H01L 23/00* (2006.01)
  *H01L 51/52* (2006.01)
(52) U.S. Cl.
  CPC ........ *H01L 51/524* (2013.01); *H01L 51/5243* (2013.01); *H01L 51/5246* (2013.01); *H01L 51/5253* (2013.01); *H01L 2224/32225* (2013.01); *H01L 2251/5361* (2013.01); *H01L 2924/12041* (2013.01); *H01L 2924/12043* (2013.01); *H01L 2924/12044* (2013.01)
(58) Field of Classification Search
  USPC ..................................................... 257/90–99
  See application file for complete search history.

(56) References Cited

U.S. PATENT DOCUMENTS

| | | | |
|---|---|---|---|
| 2010/0258935 A1 | 10/2010 | Knebel et al. | |
| 2012/0018764 A1 | 1/2012 | Choi et al. | |
| 2012/0161113 A1* | 6/2012 | Lowenthal | ............ H01L 25/048 257/40 |
| 2013/0193871 A1 | 8/2013 | Jobert | |
| 2014/0203253 A1 | 7/2014 | Goeoetz et al. | |
| 2015/0263284 A1 | 9/2015 | Schicktanz | |

FOREIGN PATENT DOCUMENTS

| | | |
|---|---|---|
| EP | 2239768 A1 | 10/2010 |
| EP | 2442008 A2 | 4/2012 |
| KR | 20100113196 A | 10/2010 |
| WO | 2011161608 A1 | 12/2011 |

OTHER PUBLICATIONS

International Search Report based on Application No. PCT/EP2014/072204 (3 Pages and 2 Pages of English Translation) dated Feb. 6, 2015 (Reference Purpose Only).

* cited by examiner

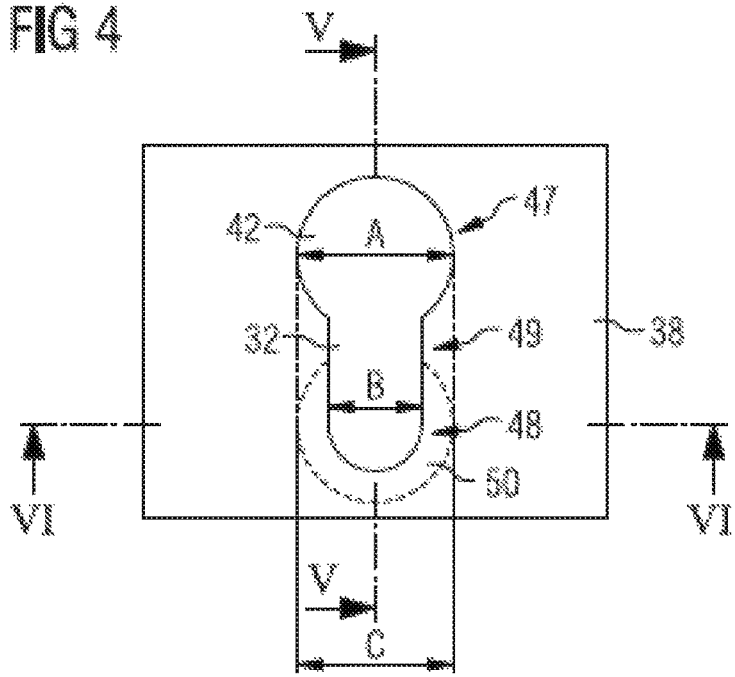
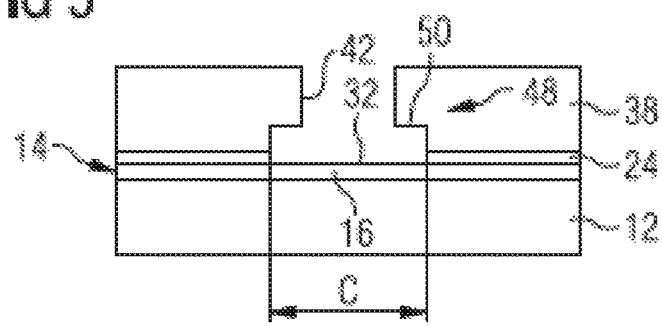
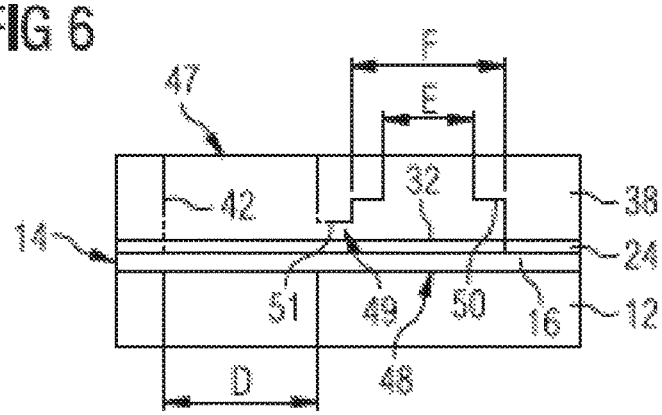

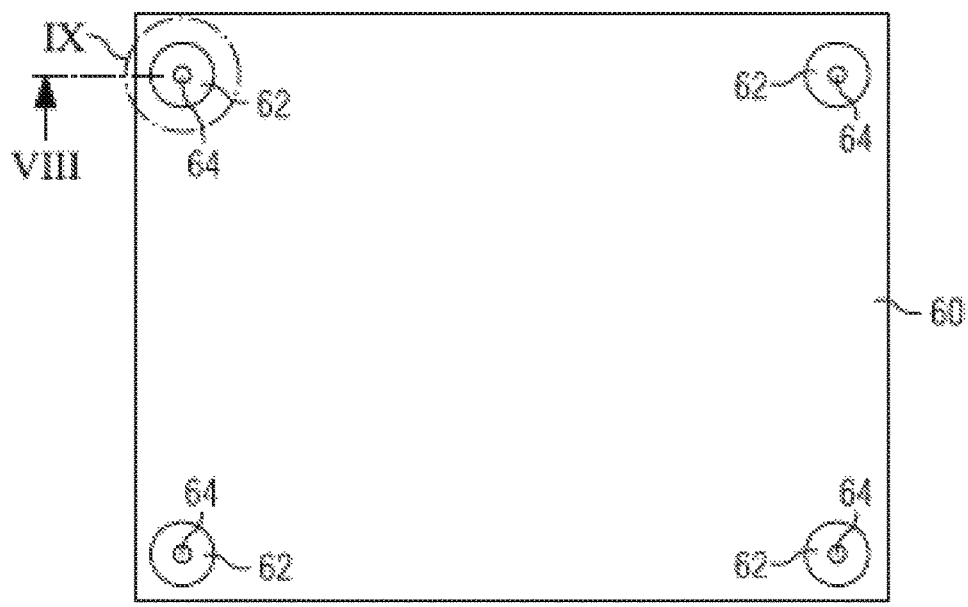
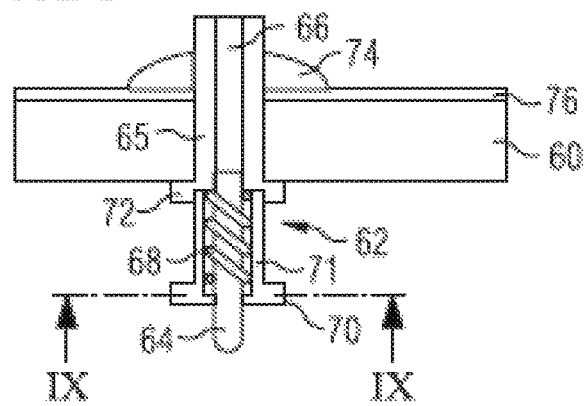
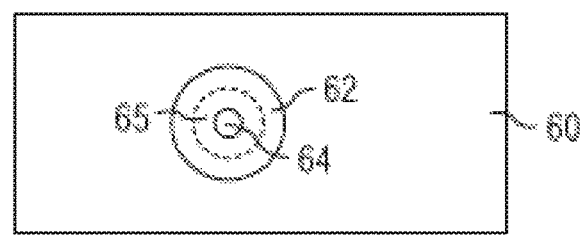

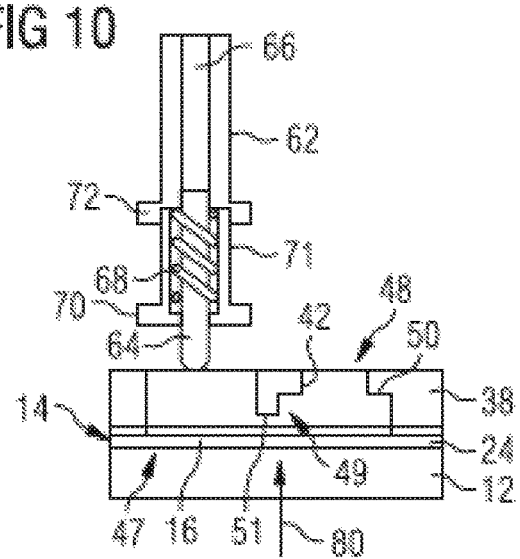
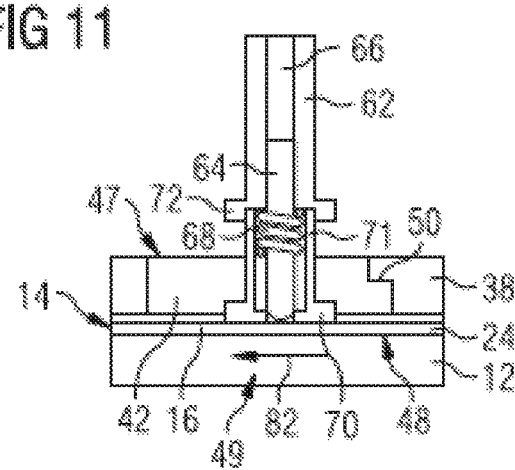
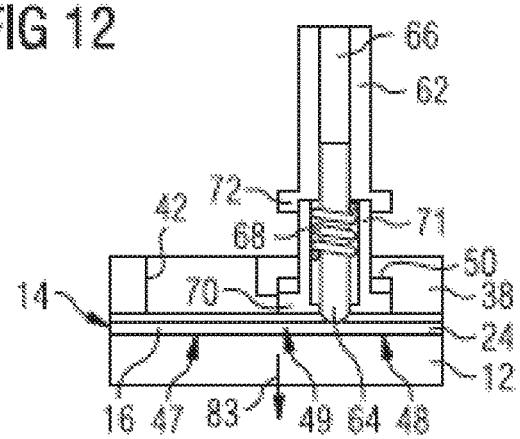

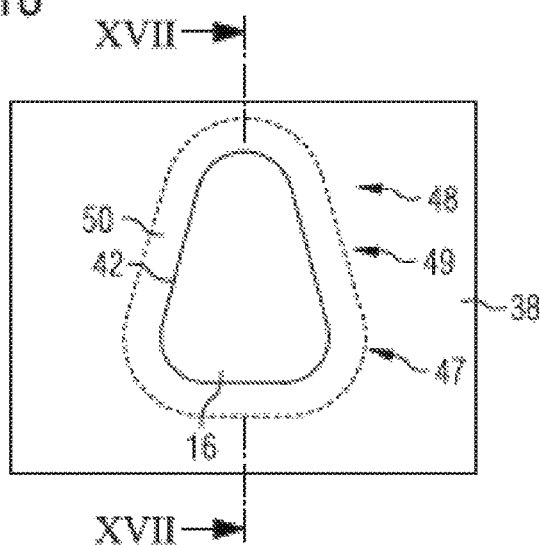
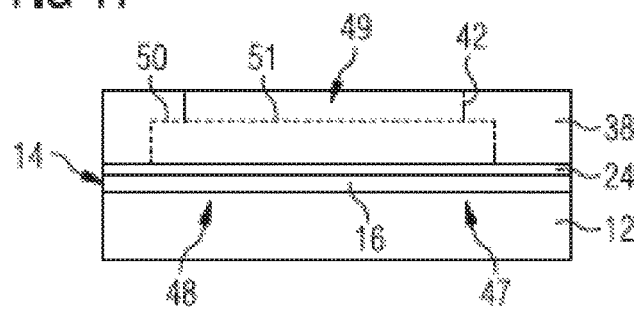
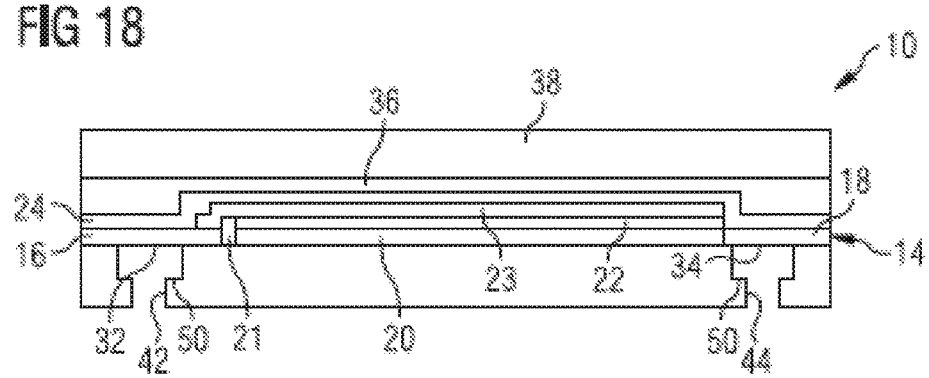

OPTOELECTRONIC COMPONENT, CONTACT-MAKING DEVICE, AND OPTOELECTRONIC SUBASSEMBLY

RELATED APPLICATIONS

The present application is a national stage entry according to 35 U.S.C. §371 of PCT application No.: PCT/EP2014/072204 filed on Oct. 16, 2014, which claims priority from German application No.: 10 2013 111 422.9 filed on Oct. 16, 2013, and is incorporated herein by reference in its entirety.

TECHNICAL FIELD

Various embodiments relate to an optoelectronic component, a contacting device and an optoelectronic assembly.

BACKGROUND

Conventional optoelectronic components, for example OLEDs, are usually constructed from a carrier body, optically functional layers, for example organic functional layers, electrode layers, an encapsulation layer, for example a thin-film encapsulation layer, against action of moisture, and a covering body, for example a cover plate. In many cases, a heat sink and/or a heat spreader, for example a metal plate or a metal film, are/is also laminated onto the cover glass. The cover plate serves as mechanical protection and as a further moisture barrier and, like the substrate, generally consists of solid glass. The cover glass is usually laminated onto the substrate over the whole area in the context of the production process. The encapsulation layer is formed between the cover plate and the substrate and generally extends over the entire substrate.

During the production process, a plurality of optoelectronic components are produced in the component assemblage and are subsequently singulated, for example by means of scribing and breaking the substrate and the cover plate. In the component assemblage, the carrier body and the cover plate extend in each case integrally over a plurality of optoelectronic components. In the component assemblage, therefore, electrical contacts of the electrode layers are not accessible, which prevents an electrical contacting and thus the possibility for electro-optical characterization early in the process sequence. During scribing and breaking into individual components, the cover glass above the contacts is removed. Afterward, if appropriate, the encapsulation layer on the contacts can be removed by means of laser ablation, for example. It is only after these process steps that the finished processed and in particular singulated optoelectronic component can be electrically contacted and electro-optically characterized. In this method, therefore, electro-optical measurements can only be carried out relatively late in the manufacturing sequence and with increased outlay in the handling of singulated optoelectronic components.

As an alternative thereto, it is known to lead the conductor tracks of all the optoelectronic components to the edge of the component assemblage. For this purpose, however, it is necessary to sacrifice a useful area that can otherwise be used for the individual optoelectronic components, as a result of which the utilization of the substrate and in particular of the substrate surface becomes poorer. Furthermore, this approach necessitates an additional process step for exposing the encapsulation in the edge region of the component assemblage prior to the further processing.

Moreover, the conventional optoelectronic component, at the contacts, substantially consists of the glass substrate without a protective cover plate and is particularly susceptible there to damage as a result of corner or edge fragmentation. Furthermore, in the conventional optoelectronic component, the lamination adhesive is applied in a structured fashion in order that the contacts can subsequently be exposed simply, which overall is relatively complex. Furthermore, a metal plate as a heat sink or heat spreader cannot be applied directly to the encapsulation layer, since the metal plate cannot be separated within the component assemblage in order to expose the contacts.

The exposed contacts of the optoelectronic components can be contacted at virtually any desired location by means of spring pins, conductive adhesive, conductor paste, crimps, etc. or by means of ACF (Anisotropic Conductive Film)-bonded printed circuit boards which make available a solderable metallic area for soldering on further contact elements (e.g. pins, eyes, cables, etc.). Usually, the contact elements are not formed in such a way that they inherently have an electrically insulated spacing with respect to lateral outer edges of the optoelectronic component. Therefore, predefined air clearances and creepage paths have to be taken into account owing to various safety standards in the design and contacting of the optoelectronic component.

Furthermore, contact pins, wires or the like can be fixed on contact strips of OLEDs by means of various processes (ACF bonding, US welding, (US) soldering, etc.). All these processes require a respective installation with corresponding operating costs. There is also a possibility of using liquid conductive adhesive for contacting wires and pins, but this also necessitates a corresponding installation for a clean process. Moreover, the curing temperatures for such conductive adhesives are usually >100° C., as a result of which the performance of the OLED can be adversely affected. Usually, the contacting elements also cannot be formed in such a way that they implicitly have the electrically insulated spacing with respect to the OLED edge (air clearances and creepage paths/standardization).

SUMMARY

In various embodiments, an optoelectronic component is provided which is simply producible and/or simply contactable and/or simply releasably contactable, which is electrically contactable and/or characterizable early in the production process and/or which is formed robustly and/or safely.

In various embodiments, a contacting device is provided which enables reliable simple and/or releasable contacting of an optoelectronic component.

In various embodiments, an optoelectronic assembly is provided which includes an optoelectronic component and a contacting device for electrically contacting the optoelectronic component and which is formed in such a way that the optoelectronic component is simply, reliably and/or simply releasably contactable by means of the contacting device.

In various embodiments, an optoelectronic component is provided. The optoelectronic component includes a carrier body. An optoelectronic layer structure is formed above the carrier body. The optoelectronic layer structure has at least one contact region for electrically contacting the optoelectronic layer structure. A covering body is arranged above the optoelectronic layer structure. The optoelectronic component includes at least one contact cutout which extends through the covering body and/or the carrier body and which has a first cutout region and a second cutout region. The first and second cutout regions lead into one another and extend in each case from an outer surface of the covering body and/or of the carrier body in a direction toward a layer plane in which the contact region is formed. A first clear width of the contact cutout near the corresponding outer surface in the first cutout region is greater than a second clear width in the second cutout region near the corresponding outer surface. The second clear width of the second cutout region near the corresponding outer surface is less than a third clear width of the second cutout region near the contact region. At least one part of the contact region is exposed at least in the second cutout region.

The contact cutout having the cutout regions having the different clear widths makes it possible that a plug element corresponding thereto can be inserted into the first cutout region simply and can then be displaced toward the second cutout region, in which the optoelectronic component is electrically contacted via the plug element. This electrical contacting can be carried out simply and can be particularly reliable. Furthermore, this contacting can be nondestructively releasable, such that the contacting can be separated again simply. As an alternative thereto, the contacting can also be embodied as non-releasable; by way of example, in order to increase the contact reliability and stability, an adhesive medium, for example an adhesive, for example an electrically conductive and/or curing adhesive, can be introduced into the contact cutout in such a way that the plug element is fixedly connected to the optoelectronic component. As an alternative to the adhesive, the adhesion medium used can be a liquid alloy which has a low melting point below the processing temperature and which, upon contact with the material of the contact element, forms a new alloy, which has a higher melting point, above the processing temperature, and which cures on account of the formation of the new alloy and forms a cohesive connection with the contact region. The electrical contacting of the optoelectronic component through the contact cutouts can be carried out without or at least virtually without construction on the optoelectronic component and/or without a particularly complex installation, a mechanical holding function of the corresponding contacting being integrated by means of the contact cutouts.

Exposing the contact region enables the electrical contacting and an electro-optical characterization of the optoelectronic component while still in the component assemblage and thus early during the production process. The contact cutout can optionally also be exposed in the first cutout region. Furthermore, the contact region formed by contact strips, for example, outside the contact cutout is protected against mechanical damage by the covering body, as a result of which the optoelectronic component is very robust. An adhesion medium, for example a lamination adhesive, for fixing the covering body can be applied to the corresponding support areally, which contributes to simple production of the optoelectronic component. Furthermore, the covering body and/or the carrier body forming the walls of the contact cutouts enable(s) simple compliance with predefined safety standards, for example air clearances and creepage paths.

The clear widths extend parallel to the outer surface of the covering body and/or of the carrier body. The layer plane in which the contact region is formed extends over the entire optoelectronic component. However, the contact region need not extend over the entire layer plane. In contrast thereto, alongside the contact region, other component parts of the optoelectronic component can be arranged in the layer plane. The layer plane thus identifies a plane which is at a specific distance from the outer surface of the covering body and/or of the carrier body, wherein the contact region is at the same distance from the outer surface of the covering body and/or of the carrier body. The corresponding outer surface can be, for example, the outer surface of the covering body if the contact cutout extends through the covering body, or the corresponding outer surface can be, for example, the outer surface of the carrier body if the contact cutout extends though the carrier body.

The contact cutout in the carrier body and/or the covering body can be formed with a depth such that a layer that forms the contact region, in the region of the contact cutout, is not removed at all or is removed only insignificantly. An areal contacting of the contact region, for example by means of the plug element, is possible in this case. As an alternative thereto, the contact cutout can also extend through the contact region, such that only a part of the contact region that forms a section of the wall of the contact cutout is exposed and is electrically contactable.

In various embodiments, the optoelectronic layer structure has an encapsulation layer and/or an adhesion medium layer. The contact cutout extends through the encapsulation layer and/or through the adhesion medium layer. The encapsulation layer serves for protecting the optically functional, for example organic, layers, for example against moisture. The adhesion medium layer serves for fixing the covering body, for example. The adhesion medium layer can be applied to the encapsulation layer areally, for example.

In various embodiments, the covering body includes or is formed from metal or glass. If the covering body includes or is formed from metal, the covering body can function as a heat sink or as a heat spreader. If the covering body includes glass, then the covering body can be separated by means of scribing and breaking. If the covering body includes metal, then the covering body can be separated by means of cutting or sawing, for example. Furthermore, the covering body may include metal and glass. By way of example, the covering body can be a glass body with a metal layer, for example a metal film, thereon.

In various embodiments, the carrier body and the covering body have exposed side edges and are formed flush with one another at the side edges. This contributes to a particularly robust construction of the optoelectronic component, since up to the edges the carrier body protects the covering body and the covering body protects the carrier body.

Furthermore, this can contribute to simple production of the optoelectronic component, since the optoelectronic component can then be separated from the component assemblage simply along uniform, flush edges.

In various embodiments, the first clear width is equal to the third clear width. This contributes to the fact that the plug element can be pushed simply from the first cutout region into the second cutout region.

In various embodiments, the entire first cutout region has the first clear width. This contributes to the fact that the plug element can be inserted into the entire first cutout region simply.

In various embodiments, the contact region is exposed at least partly in the first cutout region. This makes it possible for the electrical contacting of the optoelectronic component already to be carried out when the plug element is arranged in the first cutout region.

In various embodiments, the contact cutout has a third cutout region, which is formed between the first and second cutout regions and the inner clear width of which near the layer plane of the contact region is larger than the outer clear width thereof near the corresponding outer surface. A first transition from the third clear width to the second clear width in the second cutout region is arranged further away from the layer plane of the contact region than a second transition from the inner clear width to the outer clear width in the third cutout region. The third cutout region and the two transitions make it possible that the plug element can be latched in the contact cutout. In other words, the contact cutout can fulfill a latching function and/or form a latching means, wherein a mating latch corresponding thereto can be formed by the plug element. In particular, the plug element can be inserted into the first cutout region as far as the stop, and then led through the third cutout region, wherein a first axial section of the plug element near the axial end of the plug element is led through between the layer plane of the contact region and the transition in the third cutout region. The plug element can furthermore be led into the second cutout region, in which the plug element is moved away from the layer plane, such that the first axial section of the plug element strikes the transition in the second cutout section and the plug element is latched in the contact cutout.

In various embodiments, a contacting device for electrically contacting an optoelectronic component is provided. The contacting device includes at least one plug element. The plug element has, near a first axial end of the plug element, a first axial section, having a first external dimension. The plug element has, adjoining the first axial section, a second axial section, having a second external dimension which is smaller than the first external dimension. The plug element has a plug cutout, which extends in an axial direction through the plug element and in which is arranged a contact pin, which projects from the first axial end of the plug element. The contact pin is arranged movably in an axial direction and is mechanically coupled to a spring element. The spring element applies a force to the contact pin in a direction toward the first axial end of the plug element. The plug element has a stop in the plug cutout, said stop being formed in such a way that it prevents the contact pin from being forced out completely from the plug element.

The plug element having the two axial sections and the corresponding external dimensions makes it possible to insert the plug element simply into the first cutout region of the contact cutout of the optoelectronic component and then to displace it into the second cutout region, such that the plug element is fixed in the contact cutout in a positively locking manner.

The plug element can be formed in an electrically conductive fashion. By way of example, the plug element includes or is formed from an electrically conductive material. The electrically conductive material of the plug element may include copper, silver or gold, for example. The fact that the first axial section is formed near the first axial end can mean, for example, that the first axial end is formed by the first axial section and/or that the first axial section extends away from the first axial end of the plug element. The first axial section is formed between the first axial end of the plug element and the second axial section. The external dimension is, for example, a size which extends from one outer edge of the plug element to another outer edge of the plug element. If the plug element is formed such that it is circular in cross section, then the external dimension is, for example, an external diameter of the plug element. If the plug element is formed such that it is polygonal in cross section, then the external dimension is, for example, a diagonal from one outer corner to another outer corner of the plug element or a distance between one outer edge and another outer edge of the plug element.

The contact pin is formed in an electrically conductive fashion. By way of example, the first contact pin includes or is formed form an electrically conductive material. The electrically conductive material of the contact pin may include copper, silver or gold, for example. If the contact pin is arranged, the plug element may be formed from or may include an electrically insulating material. The electrically insulating material may include plastic, for example.

The spring element can contribute to the reliable mechanical and/or electrical coupling of the contact pin to the contact region by virtue of the spring element pressing the contact pin against the contact region when the plug element is arranged in the contact cutout. Furthermore, the spring element can contribute to the plug element latching in the second cutout region by virtue of the spring element pressing the plug element against the transition in the second cutout region. The spring element can be formed for example by a helical spring or by an elastic sleeve, for example a rubber sleeve.

In various embodiments, the plug element has, adjoining the second axial section, a third axial section, having a third external dimension which is larger than the second external dimension.

In various embodiments, the contacting device includes a carrier element, on which the plug element and at least one further plug element are arranged. The carrier element enables a plurality of plug elements to be arranged simultaneously in a plurality of contact cutouts. The plug elements can be arranged on the carrier element and the contact cutouts can be formed in a manner corresponding thereto in the optoelectronic component in such a way that the electrical contacting of the optoelectronic component by means of the contacting device cannot be carried out with an incorrect electrical polarity. In other words, the plug elements can be arranged on the carrier element and the contact cutouts can be formed in a manner corresponding thereto in the optoelectronic component in such a way that an integrated polarity-reversal protection is formed.

Optionally, the carrier element can be fixed to a mounting surface. By way of example, the carrier element can be fixed to a wall and the optoelectronic component, by means of the plug elements, can be suspended from the carrier element and thus indirectly from the wall.

In various embodiments, the carrier element is formed by a printed circuit board having at least one electrically conductive conductor track that is electrically coupled to the plug element.

In various embodiments, an optoelectronic assembly including an optoelectronic component, for example the optoelectronic component explained above, and including a contacting device, for example the contacting device explained above, is provided. The plug element has, near the first axial end of the plug element, the first axial section, having the first external dimension. The plug element has, adjoining the first axial section, the second axial section, having the second external dimension which is smaller than the first external dimension. The first external dimension of the first section of the plug element is smaller than or of the same size as the first clear width and smaller than or of the same size as the third clear width of the first and second cutout regions, respectively. The first external dimension of the first section of the plug element is furthermore larger than the second clear width of the second cutout region. The second external dimension of the second section of the plug element is smaller than or of the same size as the second clear width of the second cutout region.

In various embodiments, the plug element is arranged in the second cutout region of the contact cutout in such a way that the plug element and/or the contact pin are/is in direct physical contact with the contact region.

In various embodiments, the plug element and/or the contact pin are/is fixed with the aid of an adhesion medium in the contact cutout.

BRIEF DESCRIPTION OF THE DRAWINGS

The invention is explained in greater detail below on the basis of an exemplary embodiment, wherein also as before no distinction will be drawn specifically among the claim categories and the features in the context of the independent claims are intended also to be disclosed in other combinations. In the drawings, like reference characters generally refer to the same parts throughout the different views. The drawings are not necessarily to scale, emphasis instead generally being placed upon illustrating the principles of the disclosed embodiments. In the following description, various embodiments described with reference to the following drawings, in which:

FIG. 4 shows a detail view of the optoelectronic component in accordance with FIG. 1;

FIG. 5 shows a first sectional illustration of the detail of the optoelectronic component in accordance with FIG. 4;

FIG. 6 shows a second sectional illustration of the detail of the optoelectronic component in accordance with FIG. 4;

FIG. 7 shows a plan view of one embodiment of a contacting device;

FIG. 8 shows a detail view of the contacting device in accordance with FIG. 7 in a sectional illustration;

FIG. 9 shows a plan view of the detail of the contacting device in accordance with FIG. 8;

FIG. 10 shows a sectional illustration of one embodiment of an optoelectronic assembly in a first state;

FIG. 11 shows a sectional illustration of the optoelectronic assembly in accordance with FIG. 10 in a second state;

FIG. 12 shows a sectional illustration of the optoelectronic assembly in accordance with FIG. 10 in a third state;

FIG. 16 shows a plan view of one embodiment of a contact cutout;

FIG. 17 shows a sectional illustration of the contact cutout in accordance with FIG. 16;

FIG. 18 shows a sectional illustration of one embodiment of an optoelectronic component;

DETAILED DESCRIPTION

Figure 1:
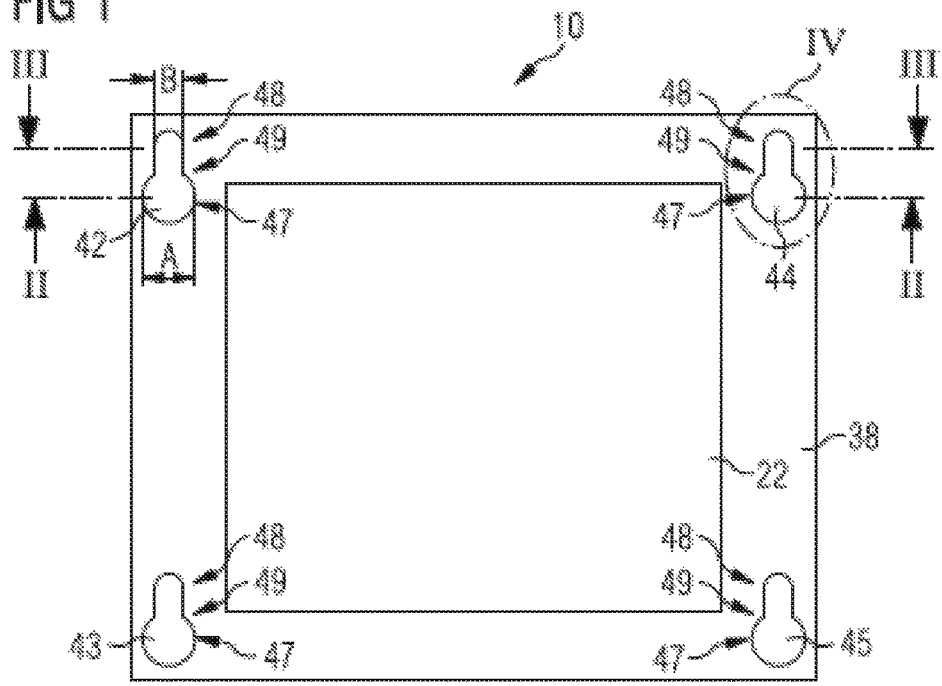
FIG. 1 shows a plan view of one embodiment of an optoelectronic component.

In the following detailed description, reference is made to the accompanying drawings, which form part of this description and show for illustration purposes specific embodiments in which the invention can be implemented. In this regard, direction terminology such as, for instance, "at the top", "at the bottom", "at the front", "at the back", "front", "rear", etc. is used with respect to the orientation of the figure(s) described. Since component parts of embodiments can be positioned in a number of different orientations, the direction terminology serves for illustration and is not restrictive in any way whatsoever. It goes without saying that other embodiments can be used and structural or logical changes can be made, without departing from the scope of protection of the present invention. It goes without saying that the features of the various embodiments described herein can be combined with one another, unless specifically indicated otherwise. Therefore, the following detailed description should not be interpreted in a restrictive sense, and the scope of protection of the present invention is defined by the appended claims.

In the context of this description, the terms "connected" and "coupled" are used to describe both a direct and an indirect connection and a direct or indirect coupling. In the figures, identical or similar elements are provided with identical reference signs, insofar as this is expedient.

The connection of a first body to a second body can be positively locking, force-locking and/or cohesive. The connections can be embodied as releasable, i.e. reversible. In various configurations, a reversible, close connection can be realized for example as a screw connection, a hook and loop fastener, a clamping, a latching connection and/or by means of the use of clips. However, the connections can also be embodied as non-releasable, i.e. irreversible. In this case, a non-releasable connection can be separated only by means of the connection means being destroyed. In various configurations, an irreversible, close connection can be realized for example as a riveted connection, an adhesively bonded connection or a soldered connection.

In the case of a positively locking connection, the movement of the first body can be restricted by a surface of the second body, wherein the first body moves perpendicularly, i.e. normally, in the direction of the restricting surface of the second body. In other words, in the case of a positively locking connection, a relative movement of the two bodies is prevented in at least one direction on account of their mutually corresponding shapes. A hook in an eye can be restricted in movement for example in at least one spatial direction. In various configurations, a positively locking connection can be realized for example as a screw connection, a hook and loop fastener, a clamping, a latching connection and/or by means of clips.

In the case of a force-locking connection, on account of a physical contact of the two bodies under pressure, a static friction can restrict a movement of the first body parallel to the second body. One example of a force-locking connection may be, for example, a bottle cork in a bottle neck or a dowel with an interference fit in a corresponding dowel hole. The force-locking connection can also be designed as a press fit.

In the case of a cohesive connection, the first body can be connected to the second body by means of atomic and/or molecular forces. Cohesive connections can often be non-releasable connections. In various configurations, a cohesive connection can be realized for example as an adhesively bonded connection, a soldered connection, for example of a glass solder, or of a metal solder, or as a welded connection.

In various embodiments, an optoelectronic assembly may include one or a plurality of optoelectronic components and one or a plurality of contacting devices for electrically contacting the optoelectronic component(s). In various embodiments, an optoelectronic component can be an electromagnetic radiation emitting component or an electromagnetic radiation absorbing component. An electromagnetic radiation absorbing component can be for example a photodiode or a solar cell. An electromagnetic radiation emitting component can be an electromagnetic radiation emitting semiconductor component and/or can be formed as an electromagnetic radiation emitting diode, as an organic electromagnetic radiation emitting diode, as an electromagnetic radiation emitting transistor or as an organic electromagnetic radiation emitting transistor. The radiation can be light in the visible range, UV light and/or infrared light, for example. In this connection, the electromagnetic radiation emitting component can be formed for example as a light emitting diode (LED), as an organic light emitting diode (OLED), as a light emitting transistor or as an organic light emitting transistor. In various embodiments, the light emitting component can be part of an integrated circuit. Furthermore, a plurality of light emitting components can be provided, for example in a manner accommodated in a common housing. An electromagnetic radiation emitting component can be formed as a top and bottom emitter. A top and/or bottom emitter can also be designated as an optically transparent component, for example a transparent organic light emitting diode.

The term "translucent" or "translucent layer" can be understood to mean that a layer is transmissive to electromagnetic radiation, for example if appropriate to the radiation emitted by the electromagnetic radiation emitting component, for example in one or a plurality of wavelength ranges, for example to light in a wavelength range of visible light (for example at least in one partial range of the wavelength range of 380 nm to 780 nm). By way of example, in various embodiments, the term "translucent layer" should be understood to mean that substantially the entire quantity of radiation coupled into a structure (for example a layer) is also coupled out from the structure (for example layer), wherein part of the light can be scattered in this case.

In various embodiments, the term "transparent" or "transparent layer" can be understood to mean that a layer is transmissive to light (for example at least in one partial range of the wavelength range of 380 nm to 780 nm), wherein electromagnetic radiation coupled into a structure (for example a layer) is also coupled out from the structure (for example layer) substantially without scattering or wavelength conversion. For the case where, for example, a monochromatic or emission spectrum-limited optoelectronic component is intended to be provided, it may suffice for the optically translucent layer structure to be translucent at least in a partial range of the wavelength range of the desired monochromatic electromagnetic radiation or for the limited emission spectrum.

Figure 2:
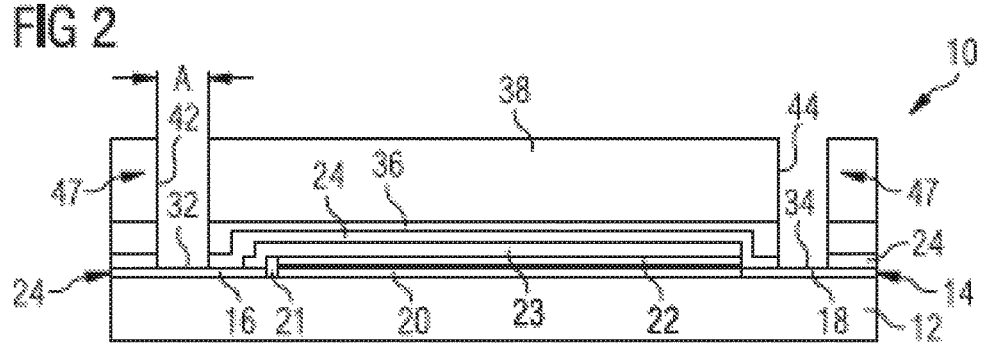
FIG. 2 shows a first sectional illustration of the optoelectronic component in accordance with FIG. 1.
Figure 3:
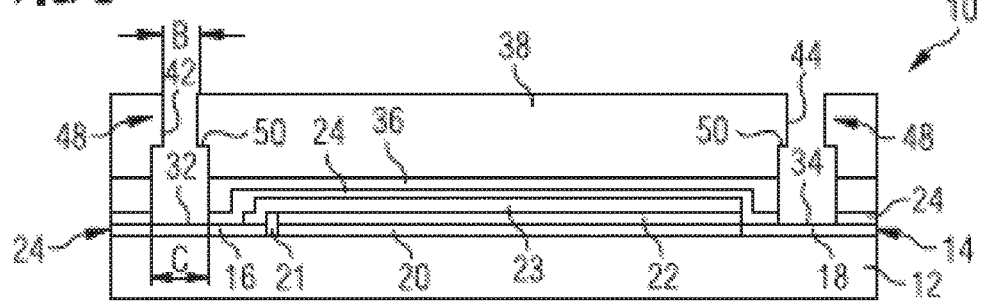
FIG. 3 shows a second sectional illustration of the optoelectronic component in accordance with FIG. 1.

FIG. 1, FIG. 2 and FIG. 3 show various views of one embodiment of an optoelectronic component 10. In particular, FIG. 1 shows a plan view of the optoelectronic component 10 and FIGS. 2 and 3 show sectional illustrations through the optoelectronic component 10 in accordance with FIG. 1 along the sectional edges depicted in FIG. 1.

The optoelectronic component 10 includes a carrier body 12. The carrier body 12 may include or be formed from, for example, glass, for example window glass, quartz, a semiconductor material and/or another suitable material, for example borosilicate, aluminum silicate and/or a standard material from the display industry. Furthermore, the carrier body 12 may include or be formed from a plastics film or a laminate including one or including a plurality of plastics films. The plastic may include or be formed from one or a plurality of polyolefins (for example high or low density polyethylene (PE) or polypropylene (PP)). Furthermore, the plastic may include or be formed from polyvinyl chloride (PVC), polystyrene (PS), polyester and/or polycarbonate (PC), polyethylene terephthalate (PET), polyethersulfone (PES) and/or polyethylene naphthalate (PEN). The carrier body 12 may include or be formed from a metal or a metal compound, for example copper, silver, gold, platinum or the like. The metal or a metal compound can also be formed as a metal film or a metal-coated film. The carrier body 12 may include one or a plurality of the materials mentioned above. The carrier body 12 can be formed as translucent or transparent.

An optoelectronic layer structure is formed on the carrier body 12. The optoelectronic layer structure includes a first electrode layer 14 including a first contact electrode 16, a second contact electrode 18 and a first electrode section 20. The second contact electrode 18 is electrically coupled to the first electrode section 20 of the optoelectronic layer structure. The first electrode section 20 is electrically insulated from the first contact electrode 16 by means of an electrical insulation barrier 21. A functional layer structure 22, for example an organic functional layer structure, of the optoelectronic layer structure is formed above the first electrode section 20. The functional layer structure 22 may include for example one, two or more partial layers, as explained in greater detail further below with reference to FIG. 19. A second electrode section 23 of the optoelectronic layer structure is formed above the organic functional layer structure 22, said second electrode section being electrically coupled to the first contact electrode 16. The first electrode section 20 serves for example as an anode or cathode of the optoelectronic layer structure. In a manner corresponding to the first electrode section, the second electrode section 23 serves as a cathode or anode of the optoelectronic layer structure.

An encapsulation layer 24 of the optoelectronic layer structure is formed above the second electrode section 23 and partly above the first contact electrode 16 and partly above the second contact electrode 18, said encapsulation layer encapsulating the optoelectronic layer structure.

An adhesion medium layer 36 is formed above the encapsulation layer 24. The adhesion medium layer 36 includes for example an adhesion medium, for example an adhesive, for example a lamination adhesion, and/or a resin. A covering body 38 is formed above the adhesion medium layer 36. The adhesion medium layer 36 serves for fixing the covering body 38 to the encapsulation layer 24. The adhesion medium layer 36 can be applied to the encapsulation layer 24 in a structured fashion, for example. The fact that the adhesion medium layer 36 is applied to the encapsulation layer 24 in a structured fashion can mean, for example, that the adhesion medium layer 36 already has a predefined structure directly upon application. By way of example, the adhesion medium layer 36 can be applied in a structured fashion by means of a dispensing or printing method.

The covering body 38 includes for example glass and/or metal. For example, the covering body 38 can be formed substantially from glass and include a thin metal layer, for example a metal film, on the glass body. Optionally, the covering body 38 can be formed substantially or completely from metal. The covering body 38 serves for protecting the optoelectronic component 10, for example against mechanical force and/or impact actions from outside. Furthermore, the covering body 38 can serve for spreading and/or dissipating heat generated in the optoelectronic component 10. By way of example, the glass of the covering body 38 can serve as protection against external actions and the metal layer of the covering body 38 can serve for spreading and/or dissipating the heat that arises during the operation of the optoelectronic component 10. The adhesion medium layer 36 and the covering body 38 extend as far as the lateral outer edges of the carrier body 12 as shown in FIGS. 1 to 3.

The optoelectronic component 10 includes a first contact cutout 42, a second contact cutout 44, a third contact cutout 43 and a fourth contact cutout 45, which extend through the covering body 38 and the adhesion medium layer 36, for example as far as the first contact electrode 16 and the second contact electrode 18, such that, for example, a first contact region 32 is exposed in the first contact cutout 42 and a second contact region 34 is exposed in the second contact cutout 44. The first contact region 32 serves for electrically contacting the first contact electrode 16 and the second contact region 34 serves for electrically contacting the second contact electrode 18. The third contact cutout 43 and the fourth contact cutout 45 correspondingly extend as far as a third contact region (not illustrated) and a fourth contact region (not illustrated).

The contact cutouts 42, 43, 44, 45 have in each case a first cutout region 47, a second cutout region 48 and a third cutout region 49. The third cutout region 49 is formed between the first cutout region 47 and the second cutout region 48. A first clear width A of the first cutout region 47 is greater than a second clear width B of the second cutout region. A clear width of the third cutout region 49 is less than the first clear width A and greater than or equal to the second clear width B. The first clear width A and the second clear width B relate to dimensions of the cutout regions 47, 48 near an outer surface of the covering body 38. In particular, the first cutout regions 47 have the first clear width A near and/or adjoining the outer surface of the covering body 38. The outer surface of the covering body 38 is depicted at the top in FIGS. 2 and 3.

Equally, the second cutout regions 48 have the second clear width B near and/or adjoining the outer surface of the covering body 38. The second cutout regions 48 have a third clear width C far from the outer surface of the covering body 38 and/or near the contact regions 32, 34 and/or adjoining the contact regions 32, 34. The third clear width C can be equal to the first clear width A. The third clear width C is greater than the second clear width B. On account of the third clear width C, a first transition 50 from the third clear width C to the second clear width B is formed in the second cutout region 48 in the covering body 38, which first transition forms an undercut and can serve as a stop for a plug element.

The optoelectronic component 10 can be singulated from a component assemblage, for example, by the carrier body 12 being scribed and then broken along its outer edges illustrated laterally in FIG. 1, and by the covering body 38 equally being scribed and then broken along its lateral outer edges illustrated in FIG. 1. As an alternative thereto, during singulation from the component assemblage, the optoelectronic component 10 can simply be cut and/or sawn along the common, flush lateral outer edges of the covering body 38 and of the carrier body 12. As an alternative thereto, the outer edges of the covering body 38 and of the carrier body 12 can be formed in a manner not flush with one another and can be cut and/or sawn independently of one another.

The optoelectronic component 10 is formed particularly robustly, in particular with respect to external mechanical actions, since both the covering body 38 and the adhesion medium layer 36 extend as far as the outer edge of the carrier body 12, and the optoelectronic component 10 is thus also formed very stably in the contact regions 32, 34.

FIG. 4 shows a detail view of one of the contact cutouts 42, 43, 44, 45 in accordance with FIG. 1, for example of the first contact cutout 42. The second, third and/or fourth contact cutout(s) 43, 44, 45 can be configured according to a configuration of the first contact cutout 42. The first cutout region 47 can be formed in a largely cylindrical fashion, for example, such that the first cutout region 47 is formed in a largely circular fashion in plan view. The second cutout region 48 can be formed for example in a partly cylindrical fashion, for example corresponding to a cylinder divided in an axial direction, and in a partly rectangular fashion. The third cutout region 49 can be formed in a rectangular fashion, for example. The first cutout region 47 leads into the second cutout region 48, specifically in the third cutout region 49. The fact that the first cutout region 47 leads into the second cutout region 48 means that the first cutout region 47 and the second cutout region 48 jointly form the first contact cutout 42. The dotted lines shown in FIG. 4 show concealed edges of the first contact cutout 42.

FIG. 5 shows a sectional illustration of the detail view in accordance with FIG. 4 in the second cutout region 48. At the transition from the third clear width C to the second clear width B, the first transition 50 is formed in the second cutout region 48. An undercut is formed by the first transition 50. The first transition 50 can serve as a stop for a plug element (not illustrated in FIG. 5) situated in the second cutout region 48. The first transition 50 as a stop can prevent the plug element arranged in the second cutout region 48 from being able to be withdrawn from the first contact cutout 42 in a direction perpendicular to the outer surface of the covering body 38. A positively locking connection between the plug element and the optoelectronic component 10 can be formed as a result.

FIG. 6 shows a second sectional illustration of the detail view in accordance with FIG. 4. The first cutout region 47 has a fourth clear width D, which for example can correspond to the first clear width A or can be different than the latter. If the fourth clear width D corresponds to the first clear width A, then the first cutout region 47 can be formed in a circular fashion, for example, in plan view. The second cutout region 48 has near the surface 38 a fifth clear width E, which for example can correspond to the second clear width B or can be different than the latter. If the fifth clear width E corresponds to the second clear width B, than the second cutout region 48 can be formed in a circular fashion, for example, in plan view. The second cutout region 48 furthermore has a sixth clear width F, which can correspond to the third clear width C, for example.

The third cutout region 49 has, near a layer plane in which the contact regions 32, 34 are formed, an inner clear width that is greater than an outer clear width in the third cutout region 49 near the outer surface of the covering body 38. A second transition 51 from the inner clear width to the outer clear width in the third cutout region 49 is arranged nearer to the layer plane than the first transition 50. As a result, in the second cutout region 48, an undercut and thus a stop is formed not only in a direction perpendicular to the layer plane and/or the outer surface of the covering body 38, but also in a direction parallel to the layer plane or the outer surface of the covering body 38, specifically in a direction toward the first cutout region 47. Furthermore, the first contact cutout 42 is thereby formed in accordance with a latching device for a latching means, for example the plug element. A positively locking connection between the plug element and the optoelectronic component 10 can be formed as a result.

FIG. 7 shows a plan view of one embodiment of a contacting device. The contacting device includes a carrier element 60 and four plug elements 62. As an alternative thereto, the contacting device may also include more or fewer plug elements 62. The carrier element 60 and the plug elements 62 are formed in a manner corresponding to the optoelectronic component 10 and the contact cutouts 42, 43, 44, 45 formed therein. In particular, the optoelectronic component 10 can be arranged on the carrier element 60 in such a way that the plug elements 62 are fixed in the contact cutouts 42, 43, 44, 45. The plug elements 62 have contact pins 64 in the region of their axial ends.

FIG. 8 shows a detailed sectional illustration of the contacting device in accordance with FIG. 7, in particular a section through one of the plug elements 62. The other plug elements 62 can be configured correspondingly or differently. The plug element 62 is arranged in a plug cutout 65 of the carrier element 60. The plug element 62 has an axial plug cutout 66 extending in an axial direction through the plug element 62.

A contact pin 64 is arranged in the plug cutout 66. The contact pin 64 is mechanically coupled to a spring element 68. The spring element 68 applies to the contact pin 64 a force in a direction toward the axial end of the plug element 62 and in a direction away from the carrier element 60. The contact pin 64 projects from the plug cutout 66 and the axial end of the plug element 62.

The plug element 62 has a first axial section 70, a second axial section 71 and optionally a third axial section 72. A first external dimension of the first axial section 70 is larger than a second external dimension of the second axial section 71. If appropriate, a third external dimension of the third axial section 72 can be larger than the second external dimension and/or of the same size as the first external dimension.

The third axial section 72 can if appropriate serve, for example, for arranging the plug element 62 simply on the carrier element 60 by virtue of the plug element 62 being inserted into the carrier cutout 65 of the carrier element 60 and the third axial section 72 serving as a stop for the plug element 62 and thus ensuring a relative position of the plug element 62 with respect to the carrier element 60 in a simple manner.

The carrier element 60 can have one, two or more electrically conducive conductor tracks 76 that can be electrically connected to the plug element 62. By means of a contact medium 74, for example, the plug element 62 can be fixed to the carrier element 60 and/or electrically coupled to the conductor track 76. The contact medium 74 can be for example an adhesion medium, for example an adhesive and/or solder.

FIG. 9 shows a plan view of the sectional illustration in accordance with FIG. 8, wherein a wall of the carrier cutout 65 that is concealed in FIG. 9 is illustrated in a dashed manner.

FIGS. 10 to 12 show various states of an optoelectronic component 10, for example of the optoelectronic component 10 explained above, for example during one embodiment of a method for electrically contacting the optoelectronic component 10 by means of a plug element 62, for example the plug element 62 explained above. Furthermore, FIGS. 10 to 12 show various states of an optoelectronic assembly including the optoelectronic component 10 and the plug element 62, for example during a method for producing the optoelectronic assembly. The states illustrate various steps of the corresponding methods. In the states shown, the plug element 62 is illustrated as an individual plug element 62 without the carrier element 38. However, as explained above the carrier element 38 and/or the further plug elements 62 can additionally be present.

FIG. 10 shows a first state of the optoelectronic assembly, in which first state, for electrically contacting the optoelectronic component 10, the plug element 62 is firstly arranged above the first cutout region 47, specifically in such a way that the contact pin 64 faces the contact cutout 42.

Afterward, the plug element 62 is inserted into the first cutout region 47. The plug element 62 can be inserted into the first cutout region 47 to an extent such that the axial end of the plug element 62 is in contact with the first contact electrode 16 and/or that the contact pin 64 is pressed into the plug cutout 66 of the plug element 62 counter to the force of the spring element 68. As an alternative to the movement of the plug element 62 toward the optoelectronic component 10, the optoelectronic component 10 can be moved in a first direction 80 toward the plug element 62.

FIG. 11 shows a second state of the optoelectronic assembly, in which second state the plug element 62 is arranged in the first contact cutout 42 and the optoelectronic component 10 is moved in a second direction 82, such that the first axial section 70 of the plug element 62 is situated substantially in the third cutout region 49. The second direction 82 can be perpendicular or at least substantially perpendicular to the first direction 80. The contact pin 64 is completely pressed into the plug cutout 66 of the plug element 62. The first axial section 70 of the plug element 62 and a first axial end of the contact pin 64 slide over the first contact electrode 16 during the movement of the optoelectronic component 10.

FIG. 12 shows a third state of the optoelectronic assembly, in which third state the optoelectronic component 10 has been moved in the second direction 82 to an extent such that the plug element 62 is situated completely in the second cutout region 48. The spring element 68 presses the optoelectronic component 10 in a third direction 38 by means of the contact pin 64. As a result, the first axial section 70 latches in behind the second transition 51 in the third cutout region 49 and the first axial section 70 strikes the first transition 50 in the second cutout region 48. This brings about a force-locking and positively locking connection between the plug element 62 and the optoelectronic component 10. The plug element 62 is latched in the first contact cutout 42. The positively locking connection contributes to reliable mechanical connection of the plug element 62 to the optoelectronic component 10.

On account of the force with which the contact pin 64 is pressed against the first contact electrode 16, a reliable electrical connection between the plug element 62 and the optoelectronic component 10 is also provided.

Figure 13:
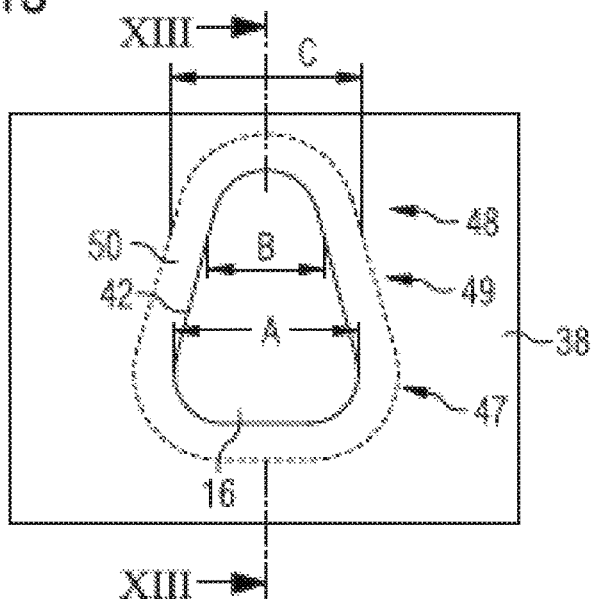
FIG. 13 shows a plan view of one embodiment of a contact cutout.

FIG. 13 shows a plan view of one embodiment of a first contact cutout 42, which can be formed for example as an alternative or in addition to the first contact cutout 42 explained above. The first contact cutout 42 can be formed for example in an optoelectronic component 10 that can for example largely correspond to a configuration of the optoelectronic component 10 explained above.

The first contact cutout 42 is formed in a triangular fashion in plan view, the corners of the triangle being rounded. The first contact cutout 42 has the first cutout region 47, the second cutout region 48 and the third cutout region 49. The first contact cutout 42 has a linear transition from the first cutout region 47 to the third cutout region 49 and further to the second cutout region 48. In FIG. 13, the dotted line shows concealed edges of the contact cutout 42.

Figure 14:
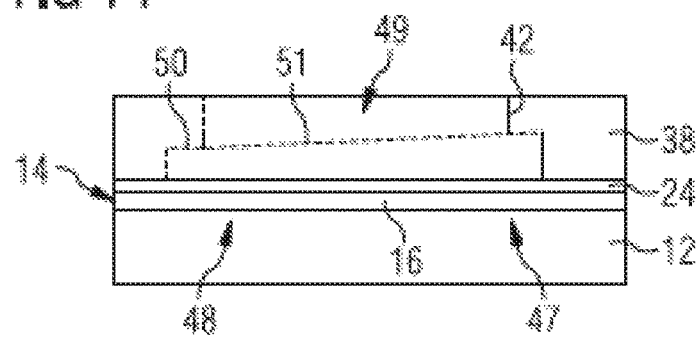
FIG. 14 shows a sectional illustration of the contact cutout in accordance with FIG. 13.

FIG. 14 shows a sectional illustration through the first contact cutout 42 in accordance with FIG. 13. A transition from the inner clear width near the first contact electrode 16 to the outer clear width near the outer surface of the covering body 38 in the first cutout region 47 is further away from the first contact electrode 16 than the second transition 51 in the third cutout region 49 and the first transition 50 in the second cutout region 48. In this case, all three cutout regions 47, 48, 49 have a greater clear width near the first contact electrode 16 than near the surface of the covering body 38.

Figure 15:
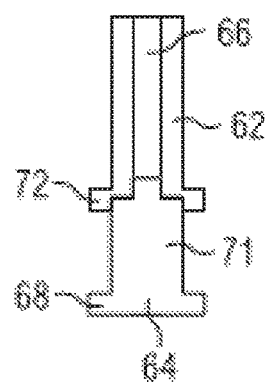
FIG. 15 shows a sectional illustration of one embodiment of a plug element.

FIG. 15 shows one embodiment of a plug element 62 that can for example largely be formed in accordance with a configuration of the plug element 62 explained above. Optionally, the plug element 62 has no contact pin 64 and no spring element 68.

The contact element 62 can be inserted into the first contact cutout 42 in accordance with FIGS. 13 and 14 in the first cutout region 47. Afterward, the plug element 62 can be moved via the third cutout region 49 into the second cutout region 48 in such a way that at least a partial segment of the first axial section 70 of the plug element 62 bears against the first transition 50. At the same time, on account of the region tapering in a direction toward the second cutout region 48, as shown in FIG. 14, between the second transition 51 and the first contact electrode 16 and the first transition 50 and the first contact electrode 16, at least one partial segment of the first axial section 70 of the plug element 62 is clamped in between the first contact electrode 16 and the first transition 50. A force-locking connection between the plug element 62 and the optoelectronic component 10 can be formed as a result.

FIG. 16 shows one embodiment of a first contact cutout 42 that can for example largely correspond to the first contact cutout 42 shown in FIG. 13.

FIG. 17 shows a sectional illustration through the first contact cutout 42 in accordance with FIG. 16, wherein the region between the second transition 51 and the first contact electrode 16 and the first transition 50 and the first contact electrode 16 of the contact cutout 42 near the first contact electrode 16 is not formed in a tapered fashion, in contrast to the first contact cutout 42 shown in FIG. 14. For contacting the optoelectronic component 10 with the first contact cutout 42 shown in FIGS. 16 and 17, by way of example, the above-explained plug element 62 having the contact pin 64 and the spring element 68 can be used in order to enable a particularly reliable mechanical and electrical coupling between the plug element 62 and the optoelectronic component 10. A positively locking and/or force-locking connection between the plug element and the optoelectronic component 10 can be formed as a result.

FIG. 18 shows a sectional illustration of one embodiment of an optoelectronic component 10 that can for example largely correspond to the optoelectronic component 10 explained above. In this embodiment of the optoelectronic component 10, the contact cutouts 42, 44 are formed in the carrier body 12 and extend through the carrier body 12 as far as the first and second contact electrodes 16, 18, respectively. The contact cutouts 42, 44 can be formed for example in a manner corresponding to the first contact cutouts 42 shown in FIG. 1, 4, 13 or 16, the sectional edge shown in FIG. 18 extending through the second cutout region 48.

Figure 19:
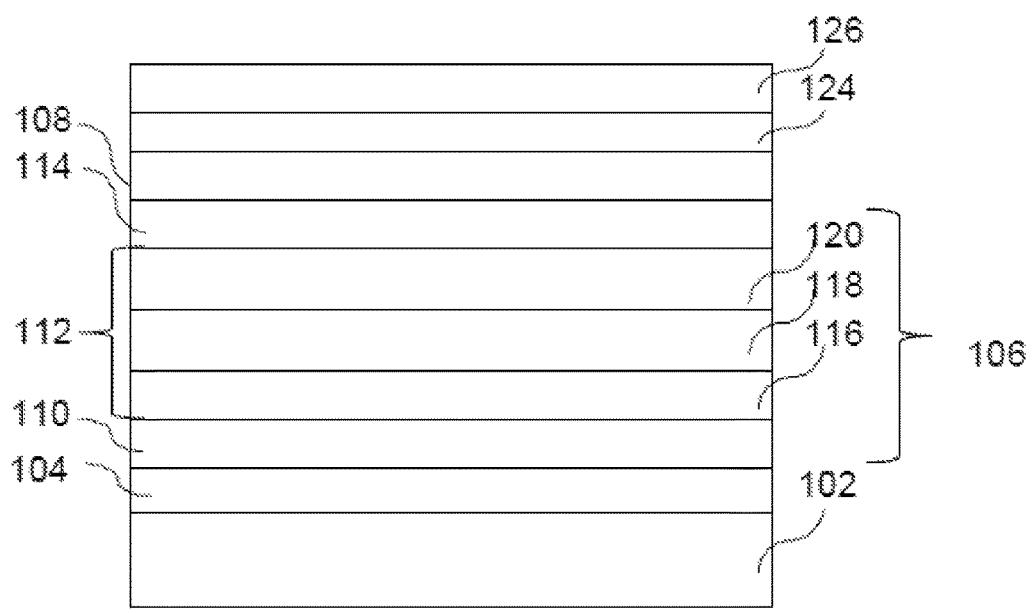
FIG. 19 shows one embodiment of a layer structure of an optoelectronic component.

FIG. 19 shows a schematic cross-sectional view of a layer structure of one embodiment of an optoelectronic component 10, for example of the layer structure of the optoelectronic component 10 explained above. In the following explanations, the main emphasis and focus are placed on the individual functional layers of the layer structure, the formation thereof and the materials thereof. The optoelectronic components 10 explained above may include for example the optoelectronic layer structure explained below.

A barrier layer 104 can optionally be arranged on or above the carrier body section 102. The barrier layer 104 can for example also be regarded as a partial layer of the carrier body section 102. The barrier layer 104 may include or consist of one or a plurality of the following substances: aluminum oxide, zinc oxide, zirconium oxide, titanium oxide, hafnium oxide, tantalum oxide, lanthanum oxide, silicon oxide, silicon nitride, silicon oxynitride, indium tin oxide, indium zinc oxide, aluminum-doped zinc oxide, and mixtures and alloys thereof. Furthermore, the barrier layer 104 can have a layer thickness in a range of 0.1 nm (one atomic layer) to 5000 nm, for example a layer thickness in a range of 10 nm to 200 nm, for example a layer thickness of 40 nm.

An electrically active region 106 of the light emitting component 100 can be arranged on or above the barrier layer 104. The electrically active region 106 can be understood as that region in which an electric current for the operation of the optoelectronic component 10 flows. The electrically active region 106 may include a bottom electrode 110, a top electrode 114 and an organic functional layer structure 112, as will be explained in even greater detail below. The bottom electrode 110 can be for example a partial region of the first electrode section 20 and/or the top electrode 114 can be for example a partial region of the second electrode section 23. The organic functional layer structure 112 can be for example a partial region of the functional layer structure 22. The bottom electrode 110 can be applied on or above the barrier layer 104 (or, if the barrier layer 104 is not present, on or above the carrier body section 102). The organic functional layer structure 112 can be applied on or above the bottom electrode 110.

The organic functional layer structure 112 may include one or a plurality of emitter layer(s) 118, for example including fluorescent and/or phosphorescent emitters, and one or a plurality of hole conduction layer(s) 116 (also referred to as hole transport layer(s) 120). In various embodiments, alternatively or additionally, one or a plurality of electron conduction layer(s) 116 (also referred to as electron transport layer(s) 116) can be provided.

Examples of emitter materials which can be used for the emitter layer 118 include organic or organometallic compounds such as derivatives of polyfluorene, polythiophene and polyphenylene (e.g. 2- or 2,5-substituted poly-p-phenylene vinylene) and metal complexes, for example iridium complexes such as blue phosphorescent FIrPic (bis(3,5-difluoro-2-(2-pyridyl) phenyl(2-carboxypyridyl) iridium III), green phosphorescent Ir(ppy)$_3$ (tris(2-phenylpyridine) iridium III), red phosphorescent Ru (dtb-bpy)$_3$*2(PF$_6$) (tris [4,4'-di-tert-butyl-(2,2')-bipyridine]ruthenium(III) complex) and blue fluorescent DPAVBi (4,4-bis[4-(di-p-tolylamino) styryl]-biphenyl), green fluorescent TTPA (9,10-bis[N,N-di (p-tolyl)amino]anthracene) and red fluorescent DCM2 (4-di-cyanomethylene)-2-methyl-6-julolidyl-9-enyl-4H-pyran) as non-polymeric emitters. Such non-polymeric emitters can be deposited for example by means of thermal evaporation. Furthermore, polymer emitters can be used which can be deposited in particular by means of a wet-chemical method, such as, for example, a spin coating method. The emitter materials can be embedded in a suitable manner in a matrix material.

The emitter materials of the emitter layer 118 can be selected for example such that the optoelectronic component 10 emits white light. The emitter layer(s) 118 may include a plurality of emitter materials that emit in different colors (for example blue and yellow or blue, green and red); alternatively, the emitter layer 118 can also be constructed from a plurality of partial layers, such as a blue fluorescent emitter layer 118 or blue phosphorescent emitter layer 118, a green phosphorescent emitter layer 118 and a red phosphorescent emitter layer 118. By means of mixing the different colors, the emission of light having a white color impression can result. Alternatively, provision can also be made for arranging a converter material in the beam path of the primary emission generated by said layers, which converter material at least partly absorbs the primary radiation and emits a secondary radiation having a different wavelength, such that a white color impression results from a (not yet white) primary radiation by virtue of the combination of primary radiation and secondary radiation.

The organic functional layer structure 112 may generally include one or a plurality of electroluminescent layer(s). The electroluminescent layer may include organic polymers, organic oligomers, organic monomers, organic small, non-polymeric molecules ("small molecules") or a combination of these substances. By way of example, the organic functional layer structure 112 may include an electroluminescent layer embodied as hole transport layer 120, thereby enabling for example in the case of an OLED an effective hole injection into an electroluminescent layer or an electroluminescent region. Alternatively, the organic functional layer structure 112 may include a functional layer embodied as electron transport layer 116, thereby enabling an effective electron injection into an electroluminescent layer or an electroluminescent region. By way of example, tertiary amines, carbazo derivatives, conductive polyaniline or polyethylene dioxythiophene can be used as material for the hole transport layer 120.

The hole transport layer 120 can be formed, for example deposited, on or above the bottom electrode 110, and the emitter layer 118 can be formed, for example deposited, on or above the hole transport layer 120. The electron transport layer 116 can be formed, for example deposited, on or above the emitter layer 118.

The organic functional layer structure 112 may include for example a stack of a plurality of light emitting diodes arranged directly one above another. The organic functional layer structure 112 can have a layer thickness of a maximum of 3 µm, for example a layer thickness of a maximum of 800 nm, for example a layer thickness of a maximum of 300 nm.

The optoelectronic component 10 may optionally include further organic functional layers, for example arranged on or above the emitter layer 118 or on or above the electron transport layer 116, which serve to further improve the functionality and thus the efficiency of the electromagnetic radiation emitting component 100.

The top electrode 114 (for example as second electrode section 23) can be applied on or above the organic functional layer structure 112. In various embodiments, the top electrode 114 may include or be formed from the same material as a configuration of the bottom electrode 110. The top electrode 114 can be formed as an anode, that is to say as a hole-injecting electrode, or as a cathode, that is to say as an electron-injecting electrode.

An encapsulation 108, for example in the form of a barrier thin-film layer or thin-film encapsulation, can optionally also be formed on or above the second electrode 114 and thus on or above the electrically active region 106. The encapsulation 108 can be a part of the encapsulation layer 24, for example. A barrier thin-film layer or a thin-film encapsulation can be understood to mean for example a layer or a layer structure which is suitable for forming an insulator region against chemical impurities or atmospheric substances, in particular against water (moisture) and oxygen. In other words, the encapsulation 108 is formed in such a way that OLED-damaging substances such as water, oxygen or solvent cannot penetrate through it or at most very small proportions of said substances can penetrate through it.

The encapsulation 108 can be formed as an individual layer (to put it another way, as a single layer). In accordance with an alternative configuration, the encapsulation 108 may include a plurality of partial layers formed one on top of another. The encapsulation 108 can be formed for example by means of a suitable deposition method, e.g. by means of an atomic layer deposition (ALD) method e.g. a plasma enhanced atomic layer deposition (PEALD) method or a plasmaless atomic layer deposition (PLALD) method, or by means of a chemical vapor deposition (CVD) method e.g. a plasma enhanced chemical vapor deposition (PECVD) method or a plasmaless chemical vapor deposition (PLCVD) method.

By using an atomic layer deposition (ALD) method, it is possible for very thin layers to be deposited. In particular, layers having layer thicknesses in the atomic layer range can be deposited. In accordance with one configuration, in the case of an encapsulation 108 including a plurality of partial layers, all the partial layers can be formed by means of an atomic layer deposition method. A layer sequence including only ALD layers can also be designated as "nanolaminate". In accordance with an alternative configuration, in the case of an encapsulation 108 including a plurality of partial layers, one or a plurality of partial layers of the encapsulation 108 can be deposited by means of a different deposition method than an atomic layer deposition method, for example by means of a vapor deposition method. In accordance with one configuration, the encapsulation 108 can have a layer thickness of 0.1 nm (one atomic layer) to 1000 nm, for example a layer thickness of 10 nm to 100 nm, for example of 40 nm.

In accordance with one configuration, the encapsulation 108 may include or be formed from one of the following substances: aluminum oxide, zinc oxide, zirconium oxide, titanium oxide, hafnium oxide, tantalum oxide, lanthanum oxide, silicon oxide, silicon nitride, silicon oxynitride, indium tin oxide, indium zinc oxide, aluminum-doped zinc oxide, and mixtures and alloys thereof. The encapsulation 108 can have a high refractive index, for example having a refractive index of 2 or more.

The cover 126 may include glass, for example, and/or can be arranged for example by means of frit bonding (glass frit bonding/glass soldering/seal glass bonding) by means of a conventional glass solder in the geometrical edge regions of the optoelectronic component 10. The cover 126 can correspond to the covering body 38, for example.

An adhesive and/or a protective lacquer 124 can be arranged on or above the encapsulation 108 and can be used to fix, for example adhesively bond, for example the cover 126 on the encapsulation 108. The optically translucent layer composed of adhesive and/or protective lacquer 124 can have a layer thickness of greater than 1 µm, for example a layer thickness of a plurality of µm. The adhesive may include or be a lamination adhesive. The adhesive and/or the protective lacquer 124 can correspond to the adhesion medium layer 36, for example.

Light scattering particles can be embedded into the layer of the adhesive and can lead to a further improvement in the color angle distortion and the coupling-out efficiency. The light-scattering particles provided can be, for example, dielectric scattering particles, such as, for example, metal oxides, such as, for example, silicon oxide ($SiO_2$), zinc oxide (ZnO), zirconium oxide ($ZrO_2$), indium tin oxide (ITO) or indium zinc oxide (IZO), gallium oxide ($Ga_2Oa$), aluminum oxide, or titanium oxide. Other particles may also be suitable provided that they have a refractive index that is different than the effective refractive index of the matrix of the translucent layer structure, for example air bubbles, acrylate, or hollow glass beads. Furthermore, by way of example, metallic nanoparticles, metals such as gold, silver, iron nanoparticles, or the like can be provided as light-scattering particles.

Between the top electrode 114 and the layer composed of adhesive and/or protective lacquer 124, an electrically insulating layer (not illustrated) can be formed, for example SiN, for example having a layer thickness in a range of 300 nm to 1.5 µm, for example having a layer thickness in a range of 500 nm to 1 µm, in order to protect electrically unstable materials, during a wet-chemical process for example.

The adhesive can be designed in such a way that it itself has a refractive index that is less than the refractive index of the cover 126. Such an adhesive can be for example a low refractive index adhesive such as, for example, an acrylate having a refractive index of approximately 1.3. Furthermore, a plurality of different adhesives can be provided which form an adhesive layer sequence. Furthermore, the adhesive 124 can be dispensed with, for example in configurations in which the cover 126 is applied to the encapsulation 108 by means of plasma spraying. The cover 126 and/or the adhesive 124 can have a refractive index (for example at a wavelength of 633 nm) of 1.55.

Furthermore, one or a plurality of antireflection layers can additionally be arranged.

The invention is not restricted to the embodiments specified. By way of example, the optoelectronic component 10 may include more or fewer contact cutouts 42, 43, 44, 45. Furthermore, all the optoelectronic components 10 shown may include more or fewer layers. By way of example, diverse optical functional layers can be formed which for example improve the efficiency of the optoelectronic component 10 or influence the emission behavior of the optoelectronic component 10. By way of example, coupling-out layers, mirror layers, antireflection layers and/or scattering layers can be formed. Furthermore, the plug elements 62 or the plug bodies 66 can be different with regard to their shape and number. Furthermore, the methods shown on the basis of the states of the optoelectronic assembly may include additional steps, for example substeps. Furthermore, the embodiments specified can be combined with one another. By way of example, the first contact cutout 42 shown in FIG. 6 can have a shape extending conically in sectional illustration, as shown in FIG. 14, or a rectilinear shape, as shown in FIG. 17. Moreover, the first contact cutouts shown in FIGS. 13 and 14, and 16 and 17, can have in each case a third cutout region 49 corresponding to the third cutout region 49 as shown in FIG. 6, such that latching of the plug element 62 in the second cutout region 48 is possible in these embodiments as well. In all the embodiments, either the optoelectronic assembly can be fixed to a mounting surface and the carrier element 60 and/or the plug elements 62 can be inserted into the contact cutouts 42, 43, 44, 45 or the carrier body 60 and/or the plug elements 62 can be fixed to a mounting surface and the optoelectronic component 10 can be placed by its contact cutouts 42, 43, 44, 45 over the plug elements 62 and be fixed thereto. The mounting surface can be for example part of an electronic device or a wall, ceiling, door or an item of furniture.

While the disclosed embodiments have been particularly shown and described with reference to specific embodiments, it should be understood by those skilled in the art that various changes in form and detail may be made therein without departing from the spirit and scope of the disclosed embodiments as defined by the appended claims. The scope of the disclosed embodiments is thus indicated by the appended claims and all changes which come within the meaning and range of equivalency of the claims are therefore intended to be embraced.

The invention claimed is:

1. An optoelectronic component, comprising:
   a carrier body,
   an optoelectronic layer structure formed above the carrier body and having at least one contact region for electrically contacting the optoelectronic layer structure,
   a covering body arranged above the optoelectronic layer structure,
   at least one contact cutout, extending through the covering body and/or the carrier body and having a first cutout region and a second cutout region, which lead into one another and which extend in each case from an outer surface of the covering body and/or of the carrier body in a direction toward a layer plane in which the contact region is formed, wherein a first clear width of the contact cutout near the corresponding outer surface in the first cutout region is greater than a second clear width in the second cutout region near the corresponding outer surface, and wherein the second clear width of the second cutout region near the corresponding outer surface is less than a third clear width of the second cutout region near the contact region, and wherein at least one part of the contact region is exposed at least in the second cutout region.

2. The optoelectronic component as claimed in claim 1, wherein the optoelectronic layer structure has an encapsulation layer and/or an adhesion medium layer, and wherein the contact cutout extends through the encapsulation layer and/or through the adhesion medium layer.

3. The optoelectronic component as claimed in claim 1, wherein the covering body comprises metal or glass.

4. The optoelectronic component as claimed in claim 1, wherein the carrier body and the covering body have exposed side edges and are formed flush with one another at the side edges.

5. The optoelectronic component as claimed in claim 1, wherein the first clear width is equal to the third clear width.

6. The optoelectronic component as claimed in claim 1, wherein the entire first cutout region has the first clear width.

7. The optoelectronic component as claimed in claim 1, wherein the contact region is exposed at least partly in the first cutout region.

8. The optoelectronic component as claimed in claim 1, wherein the contact cutout has a third cutout region, which is formed between the first and second cutout regions and the inner clear width of which near the layer plane of the contact region is greater than the outer clear width thereof near the corresponding surface, wherein a first transition from the third clear width to the second clear width in the second cutout region is further away from the layer plane of the contact region than a second transition from the inner clear width to the outer clear width in the third cutout region.

9. A contacting device for electrically contacting an optoelectronic component, comprising at least one plug element which has a first axial section, having a first external dimension, near a first axial end of the plug element and which has, adjoining the first axial section, a second axial section, having a second external dimension which is smaller than the first external dimension, wherein the plug element has a plug cutout, which extends in an axial direction through the plug element and in which is arranged a contact pin, which protrudes from the first axial end of the plug element, and wherein the contact pin is arranged movably in an axial direction and is mechanically coupled to a spring element that applies a force to the contact pin in the direction of the first axial end of the plug element, wherein the plug element has a stop in the plug cutout, said stop being formed such that it prevents the contact pin from being forced out completely from the plug element.

10. The contacting device as claimed in claim 9, wherein the plug element has, adjoining the second axial section, a third axial section, having a third external dimension, which is larger than the second external dimension.

11. The contacting device as claimed in claim 9, further comprising a carrier element, on which the plug element and at least one further plug element are arranged.

12. The contacting device as claimed in claim 11, wherein the carrier element is formed by a printed circuit board having at least one electrically conductive conductor track that is electrically coupled to the plug element.

13. An optoelectronic assembly comprising an optoelectronic component,
the optoelectronic component, comprising:
a carrier body,
an optoelectronic layer structure formed above the carrier body and having at least one contact region for electrically contacting the optoelectronic layer structure,
a covering body arranged above the optoelectronic layer structure,
at least one contact cutout, extending through the covering body and/or the carrier body and having a first cutout region and a second cutout region,
which lead into one another and which extend in each case from an outer surface of the covering body and/or of the carrier body in a direction toward a layer plane in which the contact region is formed, wherein a first clear width of the contact cutout near the corresponding outer surface in the first cutout region is greater than a second clear width in the second cutout region near the corresponding outer surface, and wherein the second clear width of the second cutout region near the corresponding outer surface is less than a third clear width of the second cutout region near the contact region, and wherein at least one part of the contact region is exposed at least in the second cutout region, and a contacting device for electrically contacting the optoelectronic component, wherein the contacting device comprises at least one plug element which has, near a first axial end of the plug element, a first axial section, having a first external dimension, and which has, adjoining the first axial section, a second axial section, having a second external dimension, which is smaller than the first external dimension, wherein the first external dimension of the first axial section is smaller than or of the same size as the first clear width of the first cutout region of the contact cutout and the third clear width of the second cutout region of the contact cutout, and wherein the first external dimension of the first axial section is larger than the second clear width of the second cutout region of the contact cutout, and wherein the second external dimension of the second axial section of the plug element is smaller than or of the same size as the second clear width.

14. The optoelectronic assembly as claimed in claim 13, wherein the contacting device comprises at least one plug element which has a first axial section, having a first external dimension, near a first axial end of the plug element and which has, adjoining the first axial section, a second axial section, having a second external dimension which is smaller than the first external dimension, wherein the plug element has a plug cutout, which extends in an axial direction through the plug element and in which is arranged a contact pin, which protrudes from the first axial end of the plug element, and wherein the contact pin is arranged movably in an axial direction and is mechanically coupled to a spring element that applies a force to the contact pin in the direction of the first axial end of the plug element, wherein the plug element has a stop in the plug cutout, said stop being formed such that it prevents the contact pin from being forced out completely from the plug element.

15. The optoelectronic assembly as claimed in claim 14, wherein the plug element is arranged in the second section of the contact cutout such that the plug element and/or the contact pin are/is in direct physical contact with the contact region.

16. The optoelectronic assembly as claimed in claim 14, wherein the plug element and/or the contact pin are/is fixed with the aid of an adhesion medium in the contact cutout.

\* \* \* \* \*